(12) United States Patent
Brundage

(10) Patent No.: US 6,612,848 B1
(45) Date of Patent: *Sep. 2, 2003

(54) ELECTRICAL COMPONENT SYSTEM WITH ROTATABLE ELECTRICAL CONTACTS

(75) Inventor: Gary L. Brundage, Concord, CA (US)

(73) Assignee: Phionics, Inc., Martinez, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,265

(22) Filed: Aug. 29, 2001

Related U.S. Application Data

(63) Continuation of application No. 09/092,313, filed on Jun. 5, 1998, now Pat. No. 6,331,117.

(51) Int. Cl.[7] ............................................... H01R 39/00
(52) U.S. Cl. .............................. 439/21; 430/86; 430/91
(58) Field of Search .............................. 439/21, 66, 91, 439/17, 22, 339, 920, 591

(56) References Cited

U.S. PATENT DOCUMENTS

| | | | |
|---|---|---|---|
| 3,038,138 A | 6/1962 | Peterson | 439/21 |
| 3,479,632 A | 11/1969 | Galles | 439/21 |
| 3,599,165 A | 8/1971 | Wendell et al. | 439/164 |
| 3,972,577 A | 8/1976 | Charles et al. | 439/21 |
| 4,590,337 A | 5/1986 | Engelmore | 179/186 |
| 4,904,190 A * | 2/1990 | Plocek et al. | 439/15 |
| 4,988,963 A | 1/1991 | Shirosaka et al. | 439/21 |
| 5,009,604 A | 4/1991 | Plocek et al. | 439/15 |
| 5,173,053 A * | 12/1992 | Swanson et al. | 439/27 |
| 5,350,308 A * | 9/1994 | Laska et al. | 439/91 |
| 5,399,093 A | 3/1995 | Schneider et al. | 439/21 |
| 5,551,882 A | 9/1996 | Whiteman, Jr. et al. | 439/21 |

(List continued on next page.)

OTHER PUBLICATIONS

Catalog entitled, "Electronic Packaging Components, ZEBRA® Elastomeric Connectors, RFI/EMI Shielding & ESD Grounding, Thermal Management Components, and Custom Silicon Moldings, Extrusions," Fujipoly® (1996).

(List continued on next page.)

Primary Examiner—Alexander Gilman
(74) Attorney, Agent, or Firm—Arthur J. Behiel

(57) ABSTRACT

A rotatable electrical connector has a pair of wiring boards. Each wiring board supports two (or more) concentric conductors that have substantially smooth coplanar surfaces. The coplanar surfaces of the concentric conductors on each wiring board define a contact plane. To provide electrical contact between the two wiring boards, each wiring board is positioned perpendicular to an axis of rotation and is supported so that the respective contact planes of the first and second wiring boards are parallel. A resilient member, such as a spring, urges the wiring boards together to establish electrical contact between the respective surfaces of corresponding conductors on the two wiring boards. The above-described wiring boards are included in a circuit module that also includes a printed circuit board, or other electrical component, sandwiched between a pair of the wiring boards. The concentric conductors of the wiring boards face away from the electrical component so that the circuit modules can be assembled in series, much as batteries are assembled inside a flashlight, to create complex electrical systems.

11 Claims, 5 Drawing Sheets

U.S. PATENT DOCUMENTS

| | | | | |
|---|---|---|---|---|
| 5,588,843 A | 12/1996 | Sobhani | | 439/22 |
| 5,690,498 A | 11/1997 | Sobhani | | 439/22 |
| 5,704,792 A | 1/1998 | Sobhani | | 439/21 |
| 5,746,606 A | 5/1998 | Sobhani | | 439/21 |
| 5,899,753 A | * 5/1999 | Wong et al. | | 439/17 |
| 6,305,944 B1 | 10/2001 | Henry et al. | | 439/22 |
| 6,331,117 B1 | * 12/2001 | Brundage | | 439/21 |

OTHER PUBLICATIONS

Declaration of Gary L. Brundage, dated May 13, 2002. 3 pages.

U.S. Department of Defense, Small Business Innovation Research (SBIR) Program Project Summary (Phase I). Topic No.: A94–091. Proposal Title, "In–Situ Electronic Sensors to Determine Analytes in Cold–Regions Soils," date Jul. 1994. 12 pages (Appendix A, Appendix B and pp. 1–10).

U.S. Department of Defense, Small Business Innovation Research (SBIR) Program Project Summary (Phase II). Topic No.: A94–091. Proposal Title, "In–Situ Electronic Sensor to Determine Analytes in Cold–Regions Soils," dated Sep. 1995. 14 pages (Appendix A, Appendix B and pp. 1–12).

Solicitation, Offer and Award, Contract No. DACA39–95–C–0029, dated Mar. 1995. Includes: Section B, supplies or Services and Prices/Costs; Section C, Description/Specs./Work Statement; Section E, Inspection and Acceptance; Section F, Deliveries or Performance; Section H, Special Contract Requirements; Section I, Contract Clauses; Section J, List of Attachments; Section K, Representations, Certifications and Other Statements of Offerors; and Section L, Instrs., Conds., and Notices to Offerors. 98 pages, (A–1, B–1, C–1, E–1, F–1 to F–2, H–1, I–1 to I–71, J–1, K–1 to K–15. L–1 to L–4).

Soliciation, Offer and Award, Contract No. DACA39–96–C–0022, dated Apr. 1996. Includes: Section B, Supplies or Services and Prices/ Costs; Section C, Description/Specs./Work Statement; Section E, Inspection and Acceptance; Section F, Deliveries or Performance; Section H, Special Contract Requirements; Index of Clauses Section I; Section I, Contract Clauses; Section J, List of Attachments; Section K, Representations, Certifications and Other Statements of Offerors; Section L, Instrs., Conds., and Notices to Offerors; and Letter from Ruth C. Little Contract Specialist/Contracting Officer. 172 pages, (A–1, B–1, C–1, E–1, F–1, H–1 to H–3, I–TC–1 to I–TC–3, I–1 to I–128, J–1, K–1 to K–28, L–1 to L–3 and 1 page letter).

Copy of E–Mail from Gary Brundage to Steve Grant (Cc: Mike Reynolds and Sharon Borland), dated May 6, 1997. Subject: Shipment of prototypes (NO3 and 02). 1 page.

Copy of E–Mail from Gary Brundage to Sharon Borland (Cc: Steve Grant and Mike Reynolds), dated May 22, 1997. Subject: Progress Report on Contract No.: DACA39–96–C–0022 for the period Apr. 21, 1996 to May 20, 1996. 1 page.

Copy of E–Mail from Gary Brundage to Sharon Borland (Cc: Steve Grant and Mike Reynolds), dated Jul. 20, 2997. Subject: Progress Report on Contract No.: DACA39–96–C–0022 for the period Jun. 21, 1997 to Jul. 20, 1997. 2 pages.

* cited by examiner

ELECTRICAL COMPONENT SYSTEM WITH ROTATABLE ELECTRICAL CONTACTS

CROSS-REFERENCE TO RELATED APPLICATION

This is a continuation application claiming the benefit under 35 U.S.C. §120 of U.S. patent application Ser. No. 09/092,313, now U.S. Pat. No. 6,331,117 entitled "Electrical Component System with Rotatable Electrical Contacts," by Gary L. Brundage, filed Jun. 5, 1998, and incorporated herein by reference.

BACKGROUND

Rotary electrical connectors are used in a variety of applications where one part must mechanically rotate with respect to another part while retaining an electrical connection between the two. Where the required extent of rotation is small, typically less than one complete revolution, hard-wired electrical connections can be used. However, hard-wired connections can be difficult and expensive to make, especially where such connections must be made at remote locations or in confined spaces.

For larger required rotations, on the order of several revolutions, wraparound wire arrangements are available. In other instances, the connector must permit an arbitrarily large extent of rotation. In such a connector, electrical connection must be maintained, and the mode of connection cannot hinder the rotational movement. For these applications, the most common type of connector is a slip ring system. A plurality of slip rings in side-by-side arrangement extends along the length of a rotating shaft. Stationary brushes make contact to the individual slip rings. Unfortunately, such systems are typically expensive, due to the number of parts, and can be too bulky for some applications.

Mohi Sobhani addresses some of the foregoing problems in his patent entitled "Rotary Electrical Connector," U.S. Pat. No. 5,588,843. That patent describes an electrical connector that includes two planar connector members positioned perpendicular to an axis of rotation and supported in rotational facing relation. One of the connector members has a set of concentric tracks, and the other has a corresponding set of protrusions positioned to contact the tracks. The two connector members are urged together by a spring so that the concentric tracts remain in electrical contact with the protrusions. A second patent to Sobhani, U.S. Pat. No. 5,690,498, entitled "Spring Loaded Rotary Connector," teaches a similar connector in which the protrusions are replaced with dimples. Both of the foregoing Sobhani patents are incorporated herein by reference.

The Sobhani connectors work well in many applications. However, the complexity of making the protrusions or dimples increases the cost of making the connectors. Further, such connectors can be sensitive to shock, which can damage the protrusions or dimples. There is therefore a need for a more robust and less expensive means of providing rotational electrical contact.

SUMMARY

The present invention is directed to a robust, inexpensive and rotatable electrical connector. In accordance with the invention, the connecter is used in conjunction with other parts to create a system of interconnected electrical components in which the individual components are easily removed for repair or to change the functionality of the system.

The inventive electrical connector includes a pair of wiring boards (e.g., printed-circuit boards) that each includes, on one side, two or more concentric conductors. The opposite sides of the two wiring boards include contacts that are electrically connected through the respective boards to the concentric conductors.

Each wiring board is held in place by a respective connector support. Contact is established between the two wiring boards when the supports are positioned so that the concentric conductors on the wiring boards face one another and are brought into electrical contact. This contact can be direct or through other components. For example, one embodiment includes a conductive elastomeric member between the wiring boards to allow some tolerance to ensure adequate conductive contact between opposing concentric conductors in the event that the wiring boards are not exactly parallel. In other embodiments, a spring or other elastic member urging one wiring board against the other supplies this tolerance.

The above-described wiring boards are used to advantage in a novel circuit module. The circuit module includes a printed circuit board, or other electrical component, sandwiched between a pair of wiring boards. The concentric conductors of the wiring boards face away from the electrical component so that the circuit module can be assembled in series with other modules much as batteries are assembled inside a flashlight. This simple configuration allows for easy assembly of systems that include circuit modules configured in accordance with the present invention, and further allows for easy substitution of modules within such systems.

DETAILED DESCRIPTION

Figure 1A:
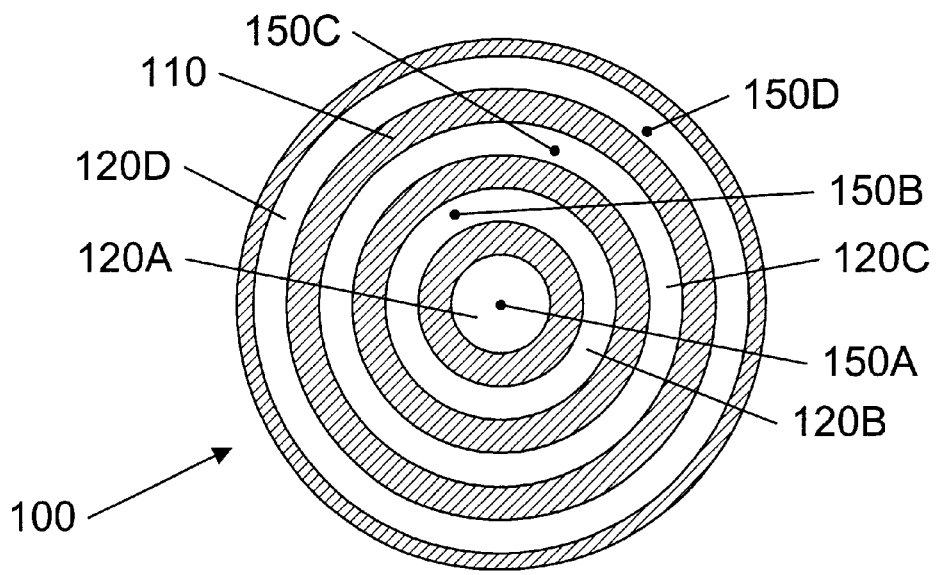
FIGS. 1A and 1B are plan views of a wiring board 100.
Figure 1B:
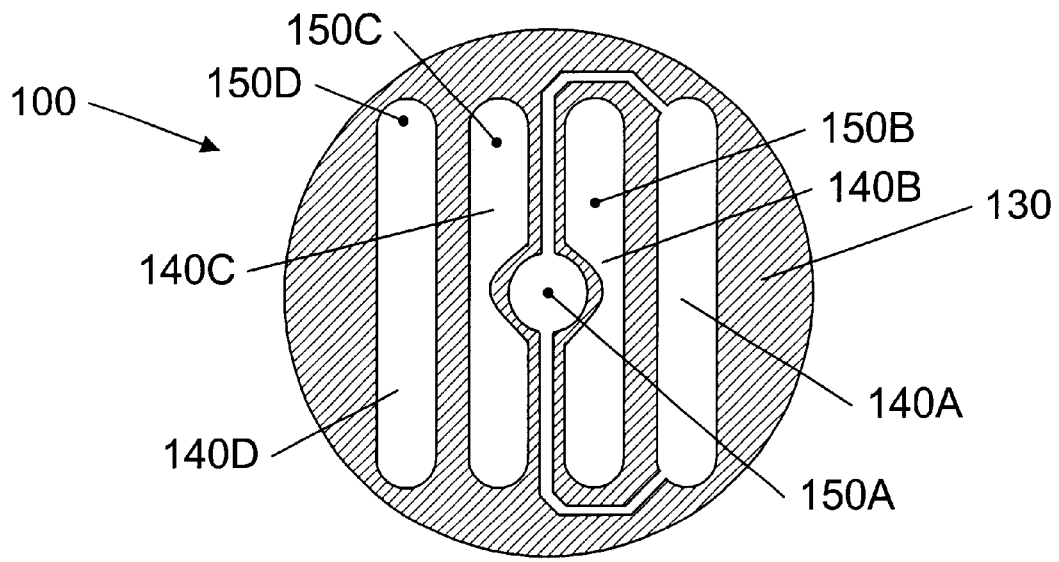

FIGS. 1A and 1B are plan views of a wiring board 100 configured in accordance with the present invention. FIG. 1A depicts a surface 110 of wiring board 100 that supports four concentric conductors 120A–D; FIG. 1B depicts the opposite surface 130 of wiring board 100, which supports four electrical contacts 140A–D. Finally, wiring board 100 includes four conductive elements 150A–D, each of which penetrates wiring board 100 to provide electrical contact between corresponding ones of conductive elements 120A–D and electrical contacts 140A–D.

Figure 2:
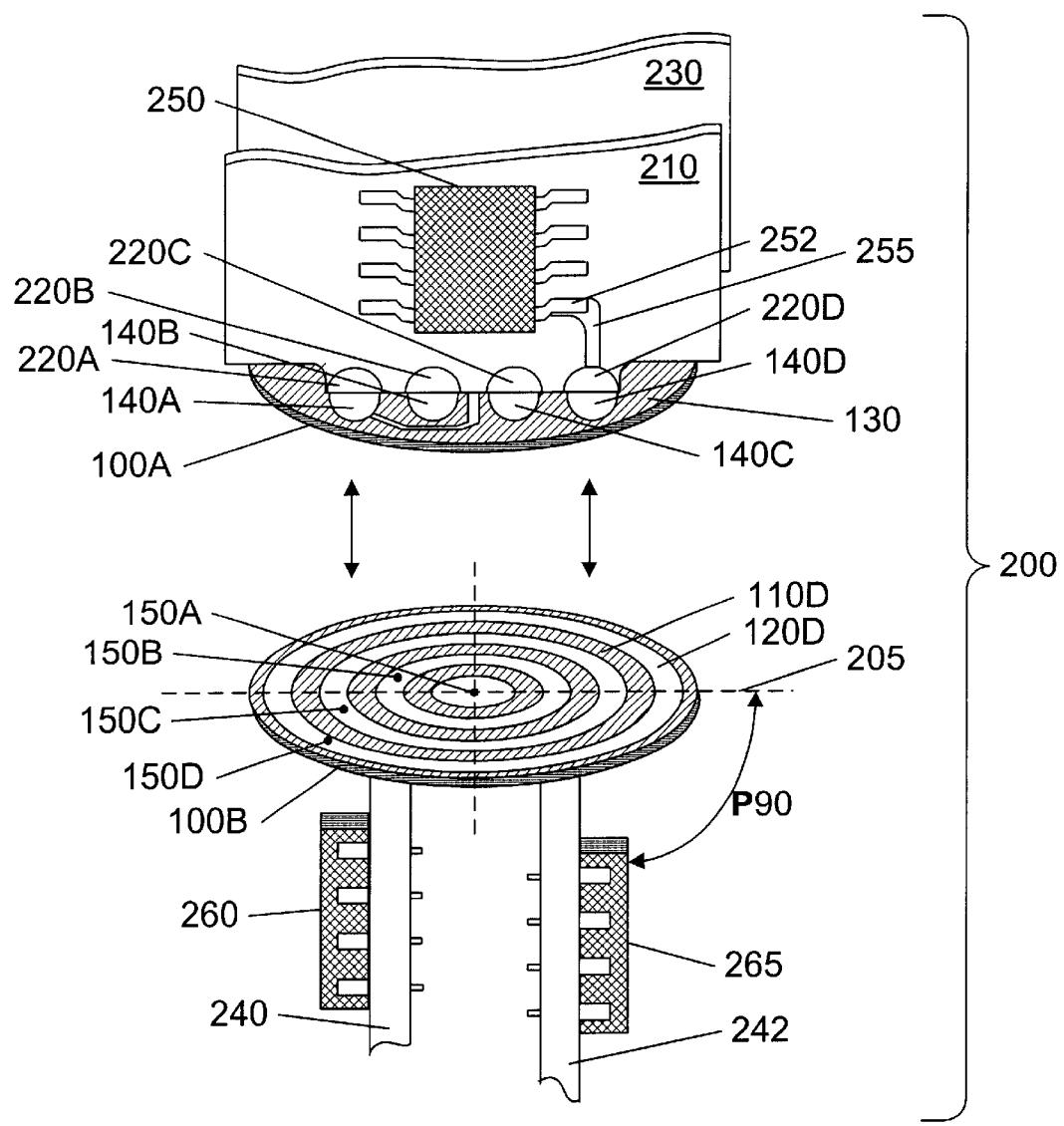
FIG. 2 depicts an electrical connector 200 in accordance with one embodiment of the present invention.

Wiring board 100 can be formed by any of a number of conventional printed-circuit board manufacturing processes. However, wiring board 100 is not limited to printed circuit boards. An example of a different but acceptable configuration is described in U.S. Pat. No. 4,590,337, to Engelmore, entitled "Rotatable Electrical Connector For Coiled Telephone Cords," which is incorporated herein by reference. In some embodiments electrical conductors 120A–D and electrical contacts 140A–D are gold plated to prevent oxidation and to reduce contact resistance:

FIG. 2 depicts an electrical connector 200 in accordance with one embodiment of the present invention. Connector 200 includes a pair of wiring boards 100A and 100B. In the embodiment of FIG. 2, wiring boards 100A and 110B are identical to wiring board 100 of FIGS. 1A and 1B, like-numbered elements being the same. The surfaces of concentric conductors 120A–D of wiring board 100B form a contact plane 205 opposite a similar contact plane (not shown) defined by the concentric conductors of wiring board 10A. Wiring boards 100A and 100B need not be identical, but may be configured in any manner desired for a given application. Such adaptations are well within the skill of those in the art.

Wiring board 100A is solder-mounted to a connector support 210, a PC board in the depicted embodiment, via a number of edge-mounted pads 220A–D, each of which corresponds to a respective one of electrical contacts 140A–D. In the depicted embodiment, wiring board 100A is similarly mounted to a second connector support 230 positioned in parallel with connector support 210. Both connector supports 210 and 230 are substantially orthogonal to wiring board 100A.

Like wiring board 100A, wiring board 100B is solder-mounted to a pair of connector supports 240 and 242 via a number of edge-mounted pads (not shown). Also like wiring board 100A, connector supports 240 and 242 are each mounted orthogonal to wiring board 100B. The configuration of connector 200 provides physically robust connections between wiring boards 100A and 100B and their respective supports. These robust connections allow for significant compressive force between wiring boards 100A and 100B to ensure adequate electrical contact between respective concentric conductors. As discussed below in connection with FIG. 6, this configuration allows components, such as the PC boards that make up connector supports 210, 230, 240, 242, to be stacked end-to-end, much like batteries in a flashlight, to create relatively complex circuits with easily substituted individual components.

Soldering wiring boards 100A and 100B to their respective connector supports 240 and 242 provides robust, low-impedance electrical connections. However, other types of connections may be used. For example, wiring board 100A might be equipped with conventional conductive clips that mate with edge-mounted pads 220A–D. Many other connector configurations will be obvious to those of skill in the art.

Conductive elements 150A–D are typically through holes internally coated with metal. In one embodiment, center conductive element 150D is configured to receive a corresponding pin extending from the center of the opposite wiring board. This configuration ensures that the opposing wiring boards remain properly aligned along the same rotational axis. In another embodiment, a concentric screw in one wiring board mates with a threaded concentric hole in the opposite wiring board. In still other embodiments, components equipped with connectors configured in accordance with the invention can be threaded onto a concentric rod, much like beads on a string. The threaded components can then be urged against one another to ensure good electrical connections between them.

Connector support 210 includes a surface-mounted integrated circuit 250. For illustrative purposes, one leg 252 of circuit 250 is connected to pad 220D via a trace 255. In one embodiment, circuit 250 is a portion of a circuit component such as an amplifier; however, circuit 250 may be any of myriad conventional integrated circuits or components that may be used for selected applications. Connector supports 240 and 242 are shown to include respective integrated circuits 260 and 265 that are mounted using leads that extend through the respective circuit boards.

Figure 3:
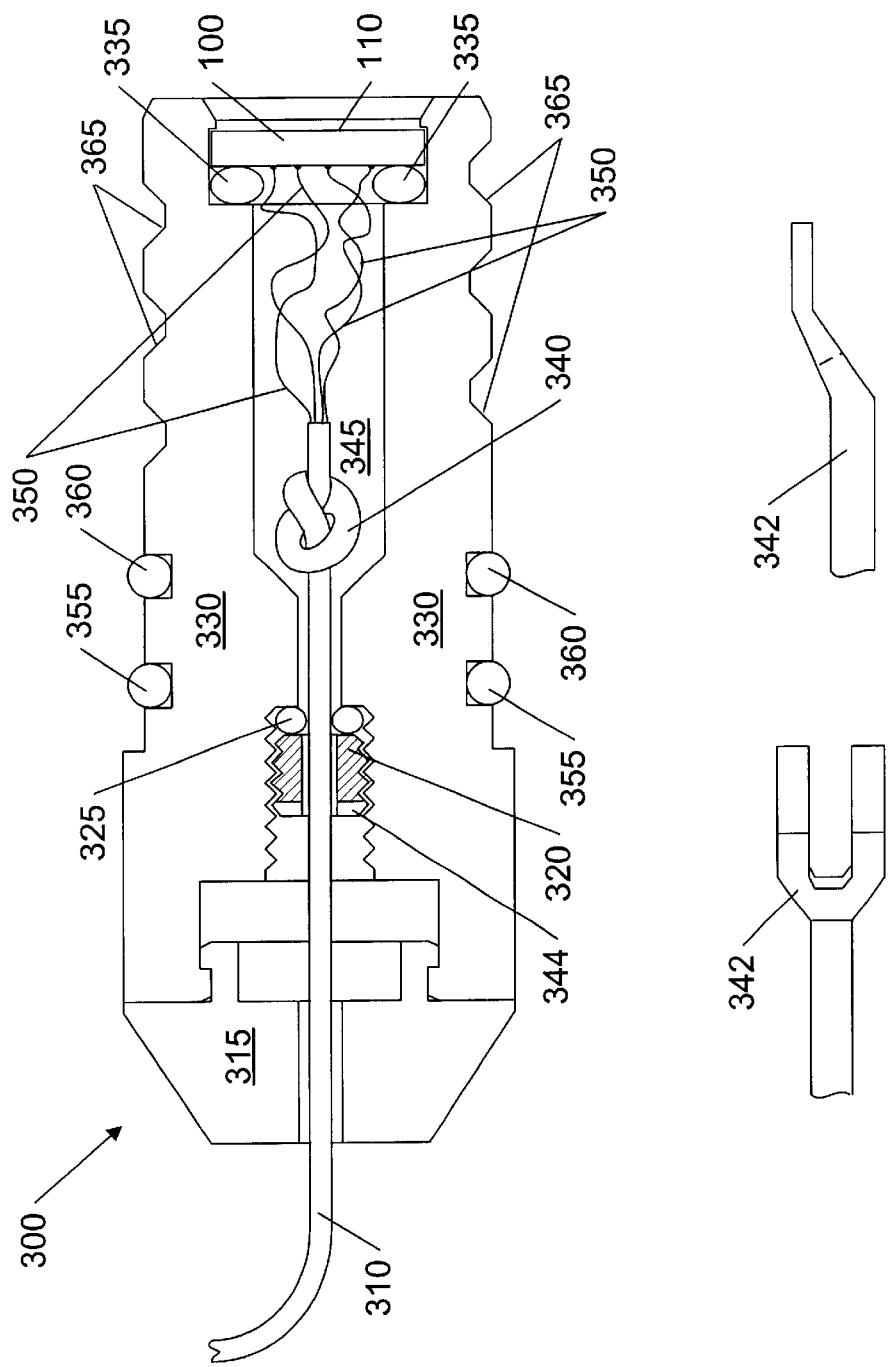
FIG. 3 depicts a connector support 300 in which a cable 310 is connected to wiring board 100 of FIG. 1.

FIG. 3 depicts a connector support 300 in which a cable 310 is connected to surface 130 (see FIG. 1) of wiring board 100. To assemble connector 300, cable 310 is threaded through an end cap 315, a compression fitting 320, an O-ring 325, a cable body 330, and a second O-ring 335. The assembler then ties a knot 340 in cable 310 to secure an end of cable 310 within cable body 330. Next, the assembler should strip the outer insulation from cable 310 and then the individual insulation off of each of internal wires 350. Each of internal wires 350 is connected to a respective one of conductive elements 140A–D (See FIG. 1), and wiring board 100 is then snapped in place. Finally, cable 310 is then pulled tight against the necked-down portion of cable body 330 before tightening compression fitting 320 to compress O-ring 325 around cable 310. A dedicated insertion tool 342, made by modifying a conventional screwdriver as shown in FIG. 3, simplifies the process of inserting compression fitting 320. The end of insertion tool 342 mates with a slot 344 in the end of compression fitting 320, allowing the assembler to turn compression fitting 320 inside cable body 330. This action compresses O-ring 325 between compression fitting 320 and the seat in cable body 330 to create a watertight seal.

A pair of O-rings 355 and 360 provides a watertight seal between cable body 330 and a cylindrical housing that will be described in more detail in connection with FIG. 6. Threads 365 are provided on the outside of cable body 330 to mate with the cylindrical housing. In one embodiment, wiring board 100 includes a peripheral tab that mates with a slot (not shown) in cable body 330 to keep wiring board 100 from rotating inside cable body 330. Such rotation can also be avoided by employing a wiring board that is not round.

Figure 4A:
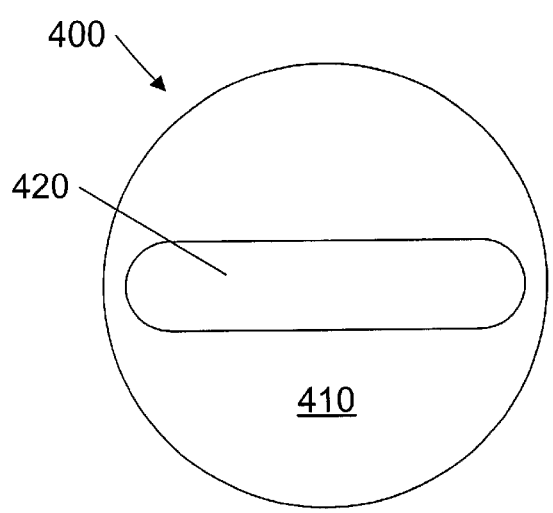
FIG. 4 depicts a conductive member 400 that may be disposed between a pair of wiring boards 100.
Figure 4B:
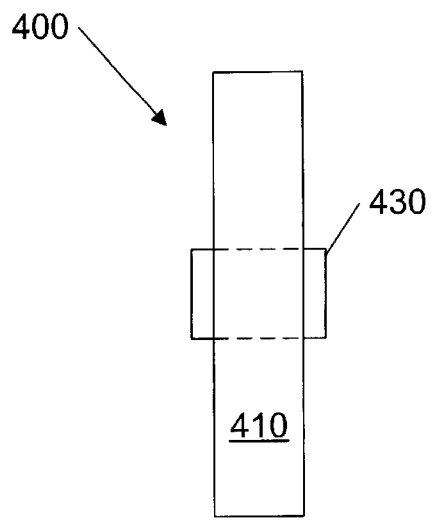

FIG. 4 depicts a conductive member 400. Referring to FIG. 2, conductive member 400 may be disposed between surface 110 of wiring board 110B and the opposing surface (not shown) of wiring board 100A. Conductive member 400 includes a dielectric retainer 410 with a slot 420. A piece of anisotropic elastomeric material 430 is pressed into slot 420. Material 430 conducts electricity in a direction perpendicular to the flat surfaces of retainer 410 but does not conduct electricity in a direction parallel to the long dimension of slot 420. Thus, material 430 provides electrical contact between opposite respective concentric conductors when sandwiched between 110B first and second contact planes, the conductive member configured to maintain electrical contact between opposing surfaces of wiring boards 101A and 100B without shorting adjacent concentric conductors on either of wiring boards 100A and 100B. Elastomeric material suitable for use in conductive member 400 is available from Fujipoli of Cranford, N.J., under the trademark Zebra™.

Conductive member 400 advantageously provides a wiping action when wiring boards 100A and 100B are brought into rotational contact. In addition, the resilience of conductive material 430 creates some tolerance that ensures adequate conductive contact between wiring boards 100A and 100B in the event that wiring boards 100A and 100B are not exactly parallel. Conductive member 400 can be aligned with adjacent wiring boards by encompassing them in a common cylinder or by using a concentric pin, rod, or screw. These and other methods of maintaining the appropriate alignment can easily be implemented by those of skill in the art.

Figure 5:
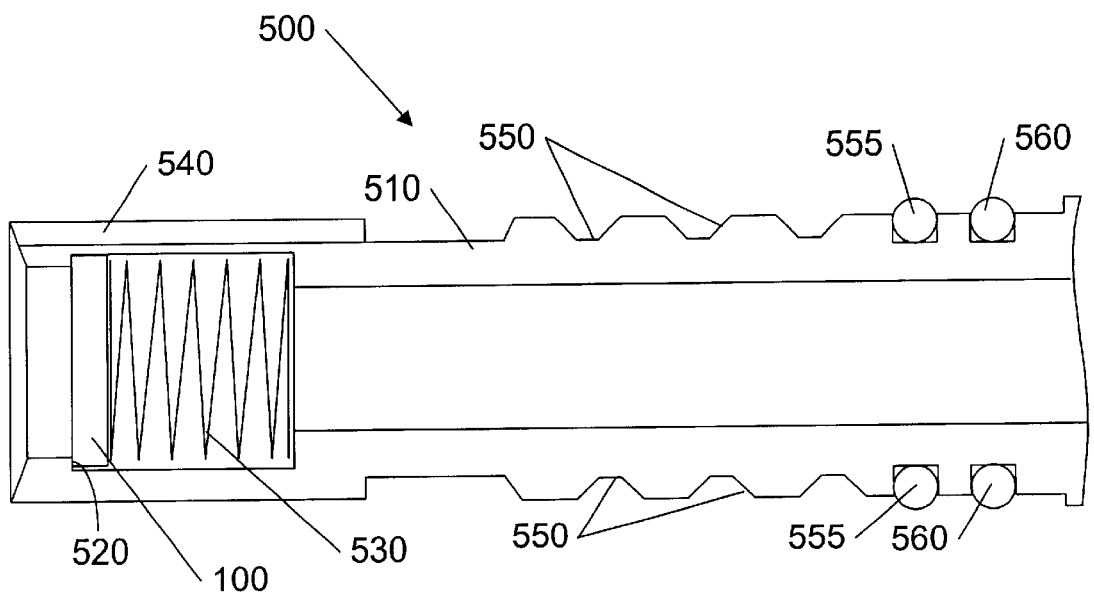
FIG. 5 is a cutaway view of a connector support 500.

FIG. 5 is a cutaway view of a connector support 500. In accordance with the invention, connector support 500 includes wiring board 100 as described above in connection with FIGS. 1A and 1B. Wiring board 100 is snapped into a connector body 510 and held in place by a lip 520. A spring 530 within connector body 510 urges wiring board 100 against lip 520. Wires or components (not shown) can be connected from within connector body 510 to conductive elements 140A–D of wiring board 100 (FIG. 1B). In one embodiment, wiring board 100 includes a peripheral tab that mates with a corresponding slot in connector body 510 to keep wiring board 100 from rotating inside connector body 510.

Connector body 510 also includes a slot 540 running parallel to the long dimension of connector body 510. This slot provides an avenue for a protrusion on the inside of a cylindrical housing that is slipped over connector body 510 during the assembly process. The protrusion mates with threads 550 to join the housing with connector support 500. A pair of O-rings 555 and 560 provides a watertight seal between connector support 500 and the cylindrical housing, which will be described in detail in connection with FIG. 6.

Figure 6:
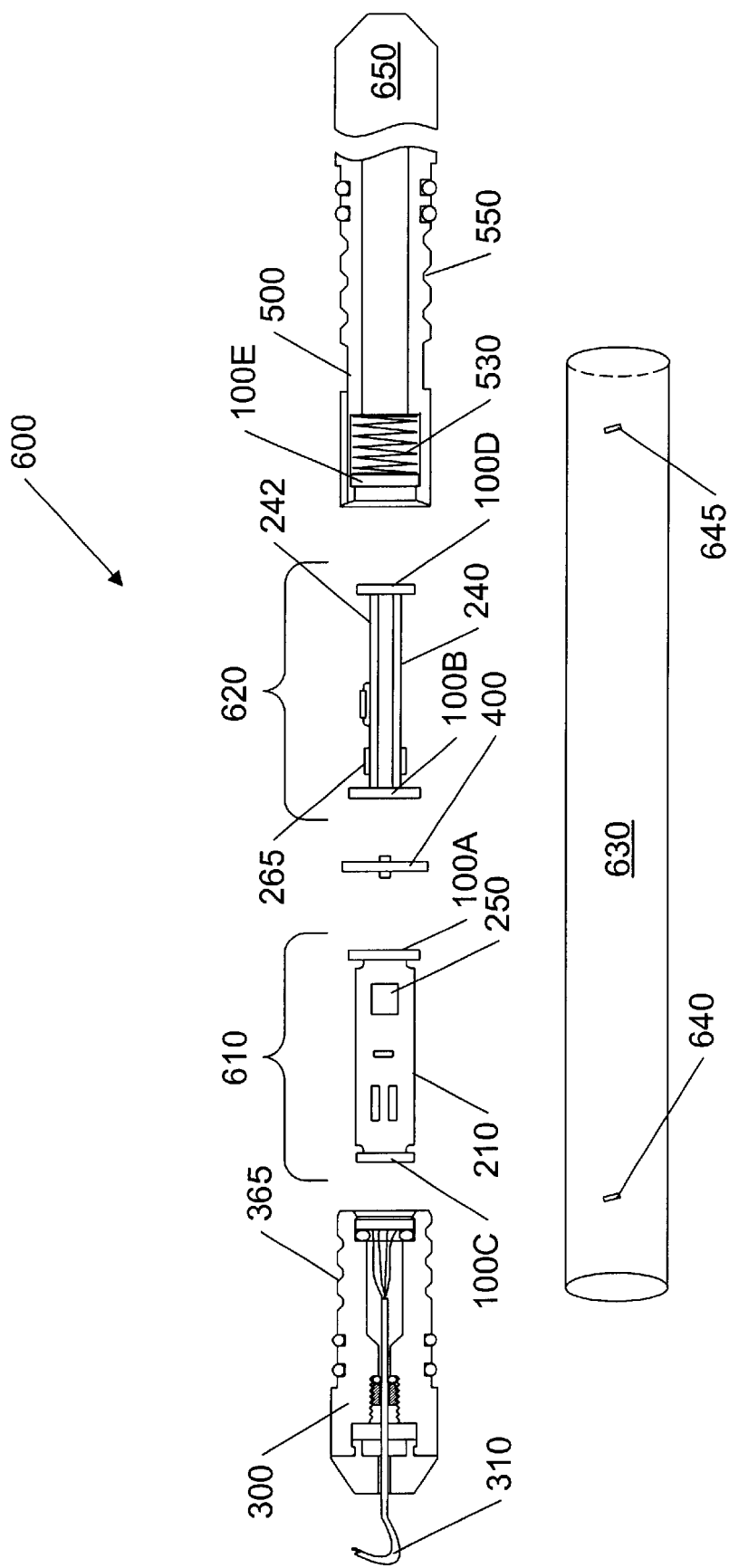
FIG. 6 is an exploded view of a system 600 configured in accordance with the present invention.

FIG. 6 is an exploded view of a system 600 configured in accordance with the present invention. System 600 includes a pair of circuit modules 610 and 620 disposed between connector supports 300 and 500 of FIGS. 3 and 5, respectively. Conductive member 400 is disposed between wiring boards 100A and 100B of respective circuit modules 610 and 620. System 600 is completed when a component housing 630, typically a stainless-steel tube, is threaded onto each of connector supports 300 and 500. A pair of dimples 640 and 645, pressed into the side of component housing 630, create corresponding protrusions on the inside surface of component housing 630. These protrusions mate with threads 550 and 365 to secure connector supports 300 and 500 to component housing 630.

Once system 600 is assembled, spring 530 exerts a compressive force on the stack of circuit components that includes circuit modules 610 and 620 and conductive member 400. This compressive force ensures excellent electrical contact between opposing wiring boards. Moreover, the radial symmetry of the concentric conductors on the respective wiring boards allows system 600 to be assembled using screw-type couplings, although other types of couplings may also be used. The various wiring boards remain stationary with respect to one another under normal operating conditions.

Each circuit module 610 and 620 can be virtually any type of electrical circuit. For example, circuit module 610 might be a preamplifier and circuit module 620 an analog-to-digital converter. Being arranged as they are, components 610 and 620 can be removed and replaced as easily as batteries in a flashlight. Moreover, component housing 630 can be substituted with a longer or shorter housing to accommodate more or fewer electrical components or to accommodate components of different sizes. Dummy components can be inserted to allow room for future additions. For example, a particular system may be adapted for use where no power supply is readily available by substituting a dummy component with a battery pack configured with connectors in accordance with the present invention.

System 600 can support a number of applications. In the embodiment of FIG. 6, System 600 includes a sensor 650 that may be attached to connector support 500 using any conventional connection method suitable for a given application. Sensor 600 may be, for example, an ion sensor for monitoring ground water, a thermometer, a microphone, a video camera, or any of a variety of other conventional transducers. In one embodiment, sensor 650 is a pH sensor for monitoring groundwater acidity or alkalinity, circuit module 620 is a differential amplifier configured to amplify an output signal from sensor 650, and circuit module 610 is a transmitter that accepts signals from the amplifier and transmits those signals through cable 310.

The order and orientation of the various modules can be critical to system function and to avoid damage. Some systems may therefore include modules that can only be installed in a particular orientation, thus ensuring that the systems cannot be assembled improperly. In one embodiment, for example, the wiring board 100D of system 600 is smaller in diameter than wiring board 100B so that circuit module 620 cannot contact wiring board 100E should circuit module 620 be installed backwards. Other keying methods will be readily apparent to those of skill in the art.

The types of connections illustrated in FIG. 6 are illustrative and not limiting. For example, while only one conductive member 400 is shown, each pair of opposing wiring boards may be provided with some form of conductive member, or with no conductive member. Further, unless otherwise specified, each of the elements described in the foregoing Figures can be made from various materials and by various methods. For Example, end cap 315, cable body 330, and connector body 510 can be machined from a plastic, such as Delrin™. The selections of materials and manufacturing techniques, dictated chiefly by particular applications and economic considerations, are well within the ability of those of skill in the art.

While the present invention has been described in connection with specific embodiments, variations of these embodiments will be obvious to those of ordinary skill in the art. For example, system 600 is not limited to sensor applications; wiring board 100 may include a greater or lesser number of concentric conductors; circuit modules, such as circuit modules 610 and 620, can be made to snap together and to other modules and supports; and connector body 300 may be used in conjunction with another similar connector body with or without intermediate electrical components. Still other variations will be readily apparent to those of skill in the art. Therefore, the spirit and scope of the appended claims should not be limited to the foregoing description.

What is claimed is:

1. A circuit module comprising:
   a. an electrical circuit board extending in a circuit-board plane and including circuit components and having first and second edges;
   b. a first wiring board connected to the first edge of the electrical circuit board, the first wiring board including concentric first and second conductors in electrical contact with the components;
   c. wherein the first and second conductors include substantially smooth planar surfaces, the surfaces being orthogonal to the circuit-board plane; and
   d. a second wiring board connected to the second edge, the second wiring board including third and fourth conductors in electrical contact with the components.

2. The circuit module of claim 1, wherein the third and fourth conductors are concentric.

3. A connector support for attaching first and second wires to respective first and second conductors of a threaded component housing, the connector support comprising:
   a. a cable body including threads and encircling the first and second wires, wherein the threads rotatably engage the threaded component housing to attach the cable body to the component housing; and b. a wiring board connected to the cable body and having concentric third and fourth conductors contacting the respective first and second conductors, wherein the third conductor is electrically connected to the first wire and the fourth conductor is electrically connected to the second wire.

4. The connector support of claim 3 that, when attached to the component housing, further comprises an O-ring disposed between the cable body and the component housing.

5. The connector support of claim 3, further comprising a watertight seal between the wires and the cable body.

6. A system comprising:
   a. a connector support;
   b. a wiring board electrically connected to the connector support, the wiring board supporting concentric first and second conductors, wherein the first conductor and the second conductor include substantially coplanar surfaces that define a contact plane; and
   c. an elastomeric conductor disposed in rotational contact with the contact plane;
   d. wherein the elastomeric conductor conducts electricity in a first direction perpendicular to the contact plane and wherein the elastomeric does not conduct electricity in a second direction parallel to the contact plane; and
   e. wherein the first conductor is a ring having a diameter, and wherein the elastomeric conductor extends lengthwise across the diameter of the first conductor.

7. The system of claim 6, further comprising a retainer adapted to support the elastomeric conductor.

8. The system of claim 7, wherein the retainer comprises a slot encompassing the elastomeric conductor.

9. A sensor system comprising:
   a. a component housing;
   b. a sensor connected to the housing;
   c. a circuit module disposed within the housing and electrically connected to the sensor;
   d. a connector support connected to the housing; and
   e. a rotational electrical connector disposed between the connector support and the circuit module, wherein the electrical connector is adapted to communicate electrical signals between the connector support and the circuit module, the connector including:
      i. a wiring board supporting concentric first and second conductors, the first conductor lying in a first contact plane; and
      ii. a plurality of elastic conductors disposed in rotational contact with the wiring board and adapted to electrically isolate the concentric first and second conductors and to pass signals between the connector support and the circuit module;
      iii. wherein the elastic conductors are portions of at least one elastomeric conductor, and wherein the elastomeric conductor conducts electricity in a first direction perpendicular to the contact plane and wherein the elastomeric does not conduct electricity in a second direction parallel to the contact plane; and
      iv. wherein the first conductor is a ring having a diameter, and wherein the elastomeric conductor extends across the diameter of the first conductor.

10. A ground water monitoring system comprising:
    a. a cylindrical component housing having a sensor end and a cable end;
    b. a sensor connected to the sensor end of the housing;
    c. a circuit module disposed within the housing and electrically connected to the sensor;
    d. a connector support having a cord-receiving end and a threaded end rotatably connected to the cable end of the housing;
    e. a circular wiring board disposed within the connector support at the threaded end, the wiring board including first and second concentric conductors adapted to provide electrical contact to the circuit module;
    f. a cable extending through the cord-receiving end of the support, the cable including a first wire connected to the first of the concentric conductors and a second wire connected to the second of the concentric conductors;
    g. an elastomeric conductor extending across the first and second conductors along the diameter of the wiring board;
    h. a dielectric retainer having a slot adapted to support the elastomeric conductor; and
    i. a resilient member disposed within the housing and positioned to compress the elastomeric conductor against the concentric first and second conductors.

11. The system of claim 10, wherein the resilient member comprises a spring.

* * * * *